(12) United States Patent
Honda

(10) Patent No.: US 7,859,915 B2
(45) Date of Patent: Dec. 28, 2010

(54) SEMICONDUCTOR DEVICE AND METHOD OF CONTROLLING THE SAME

(75) Inventor: Yasuhiko Honda, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 852 days.

(21) Appl. No.: 11/770,381

(22) Filed: Jun. 28, 2007

(65) Prior Publication Data

US 2008/0001200 A1 Jan. 3, 2008

(30) Foreign Application Priority Data

Jun. 29, 2006 (JP) ............... 2006-179290

(51) Int. Cl.
*G11C 7/10* (2006.01)
(52) U.S. Cl. .............. 365/189.03; 365/230.03
(58) Field of Classification Search ........... 365/189.03, 365/230.03, 51, 52, 63; 257/48, 777
See application file for complete search history.

(56) References Cited

U.S. PATENT DOCUMENTS

| 6,522,581 B2 | 2/2003 | Takata et al. |
| 7,570,522 B2 * | 8/2009 | Hara .................. 365/189.03 |
| 2002/0088633 A1 * | 7/2002 | Kong et al. .............. 174/52.2 |
| 2005/0005218 A1 | 1/2005 | Braun |
| 2006/0076690 A1 * | 4/2006 | Khandros et al. ........... 257/777 |

FOREIGN PATENT DOCUMENTS

| JP | 5-299616 | 11/1993 |
| JP | 2005-190312 | 7/2005 |

* cited by examiner

*Primary Examiner*—Vu A Le
(74) *Attorney, Agent, or Firm*—Oblon, Spivak, McCleland, Maier & Neustadt, L.L.P.

(57) ABSTRACT

A semiconductor device comprises a board, a first semiconductor storage device placed on the board, and a second semiconductor storage device placed on the board. Each of the first and second semiconductor storage devices has a first pad for inputting a chip enable signal, a second pad for inputting a write enable signal, a third pad for inputting an output enable signal, a fourth pad for inputting an address signal, and a fifth pad for inputting data. The first semiconductor storage device has a sixth pad which is electrically connected to the first pad of the second semiconductor device, and the second semiconductor storage device has a seventh pad which is electrically connected to the first pad of the first semiconductor device.

12 Claims, 8 Drawing Sheets

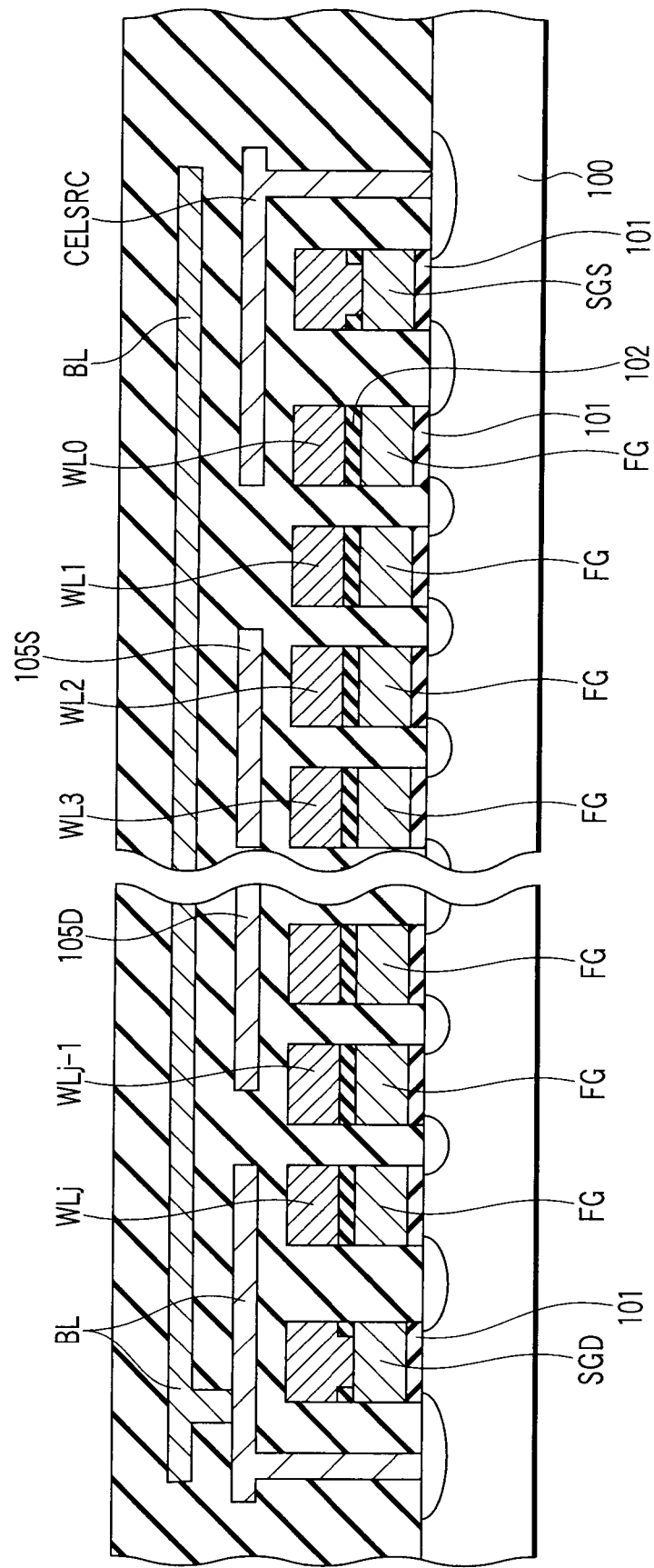
F I G. 4

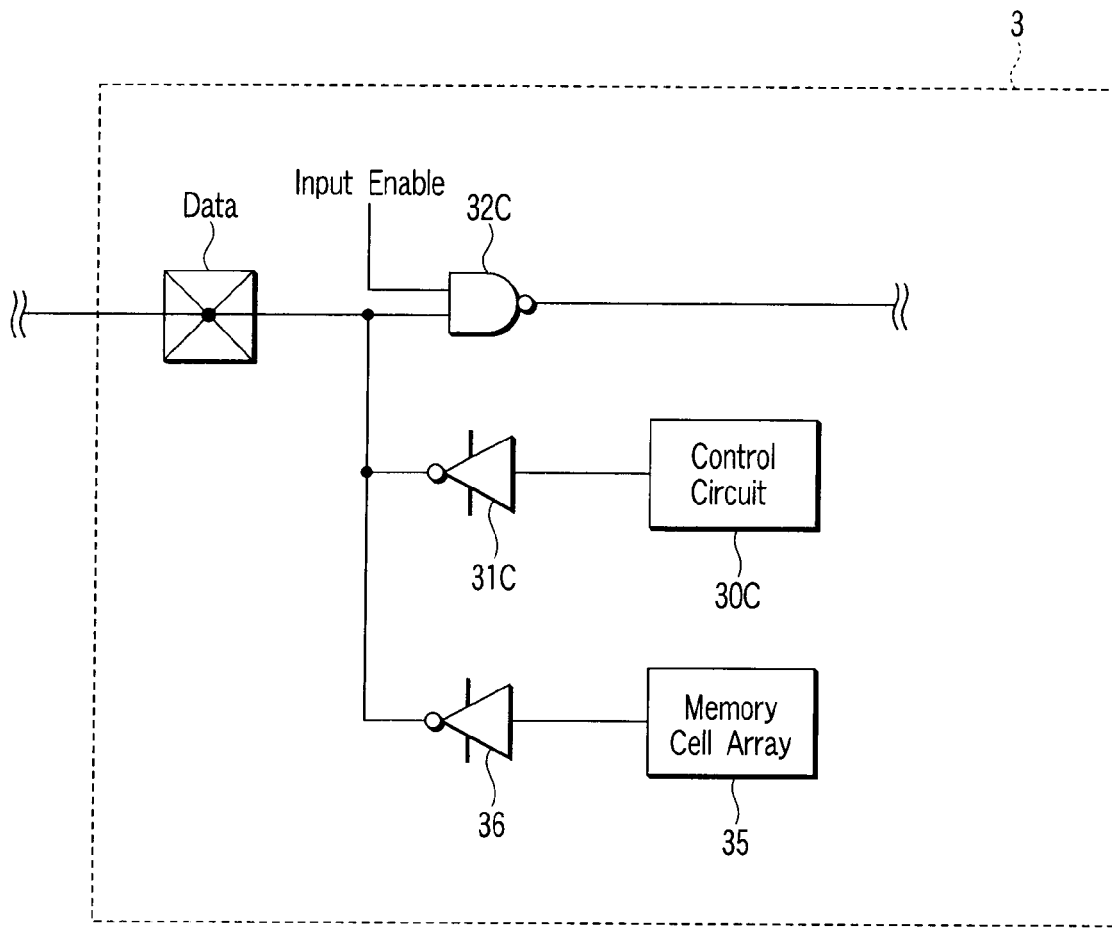
F I G. 7
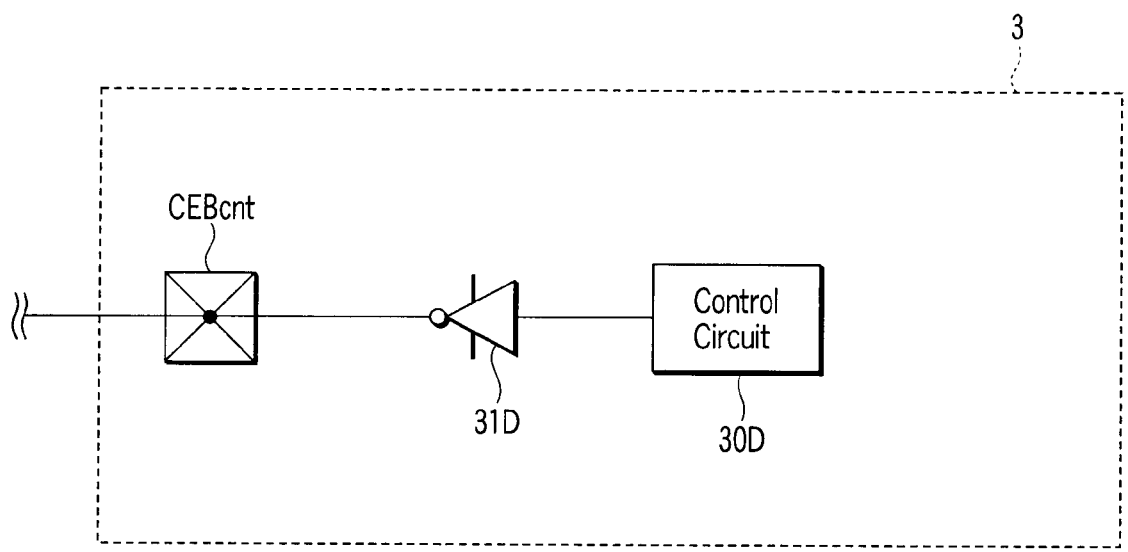
F I G. 8

SEMICONDUCTOR DEVICE AND METHOD OF CONTROLLING THE SAME

CROSS-REFERENCE TO RELATED APPLICATIONS

This application is based upon and claims the benefit of priority from prior Japanese Patent Application No. 2006-179290, filed Jun. 29, 2006, the entire contents of which are incorporated herein by reference.

BACKGROUND OF THE INVENTION

1. Field of the Invention

The present invention relates to a semiconductor device and a method of controlling the same, more particularly to a multi-chip package in which a plurality of memories is integrated in a single package.

2. Description of the Related Art

Normal CPUs read data from a nonvolatile read-Only memory (ROM), then transfer the data to a volatile random access memory (RAM) which is fast in data rewriting speed and perform operations upon the data. At a certain time, the data which has been operated upon is transferred from the volatile RAM to the nonvolatile ROM and retained in the ROM.

In recent years, a technique has been developed which packages a ROM and a RAM together (multi-chip package, which is hereinafter referred to as an MCP), which allows the area occupied by memories to be reduced (see, for example, JP-A No. 5-299616 [KOKAI]).

With the MCP technique, however, although the area occupied by semiconductor devices can be reduced, conventional control is merely used as it is for control of the ROM and the RAM. The MCP technique leaves room for improvement in transfer of data between the ROM and the RAM.

BRIEF SUMMARY OF THE INVENTION

According to an aspect of the present invention, there is provided a semiconductor device comprising: a board; a first semiconductor storage device which is a volatile semiconductor storage device placed on the board; and a second semiconductor storage device which is a nonvolatile semiconductor storage device placed on the board, each of the first and second semiconductor storage devices having a first pad for inputting a chip enable signal, a second pad for inputting a write enable signal, a third pad for inputting an output enable signal, a fourth pad for inputting an address signal, and a fifth pad for inputting data, the first semiconductor storage device having a sixth pad which is electrically connected to the first pad of the second semiconductor device, and the second semiconductor storage device having a seventh pad which is electrically connected to the first pad of the first semiconductor device.

According to another aspect of the present invention, there is provided a method of controlling a semiconductor device having first and second semiconductor storage devices comprising: initializing an address signal; setting a first address of the first semiconductor storage device in the address signal to read data from the memory cell array of the first semiconductor storage device; issuing a write command to the second semiconductor storage device; writing the data into the second semiconductor storage device; making a decision of whether or not the data has been written into the second semiconductor storage device; if the result of the decision is that the data has not been written into the second semiconductor storage device, carrying out writing of data again; if the result of the decision is that the data has been written into the second semiconductor storage device, making a decision of whether or not the first address has reached a predetermined value; and if the first address has not reached the predetermined value, setting a second address different from the first address by the second semiconductor storage device.

According to still another aspect of the present invention, there is provided a method of controlling a semiconductor memory having first and second semiconductor storage devices comprising: initializing an address signal after a particular command has been input; setting a first address of the first semiconductor storage device in the address signal to read data from the first semiconductor storage device; issuing a test command to the second semiconductor storage device to make a test; if the result of the test is normal, making a decision of whether or not the first address has reached a predetermined value; and if the first address has not reached the predetermined value, setting a second address different from the first address by the first semiconductor storage device.

BRIEF DESCRIPTION OF THE SEVERAL VIEWS OF THE DRAWING

FIG. 4 is a sectional view of the flash memory;

FIG. 7 shows a circuit arrangement associated with the data signal pad;

FIG. 8 shows a circuit arrangement associated with the chip enable control pad;

DETAILED DESCRIPTION OF THE INVENTION

Figure 1:
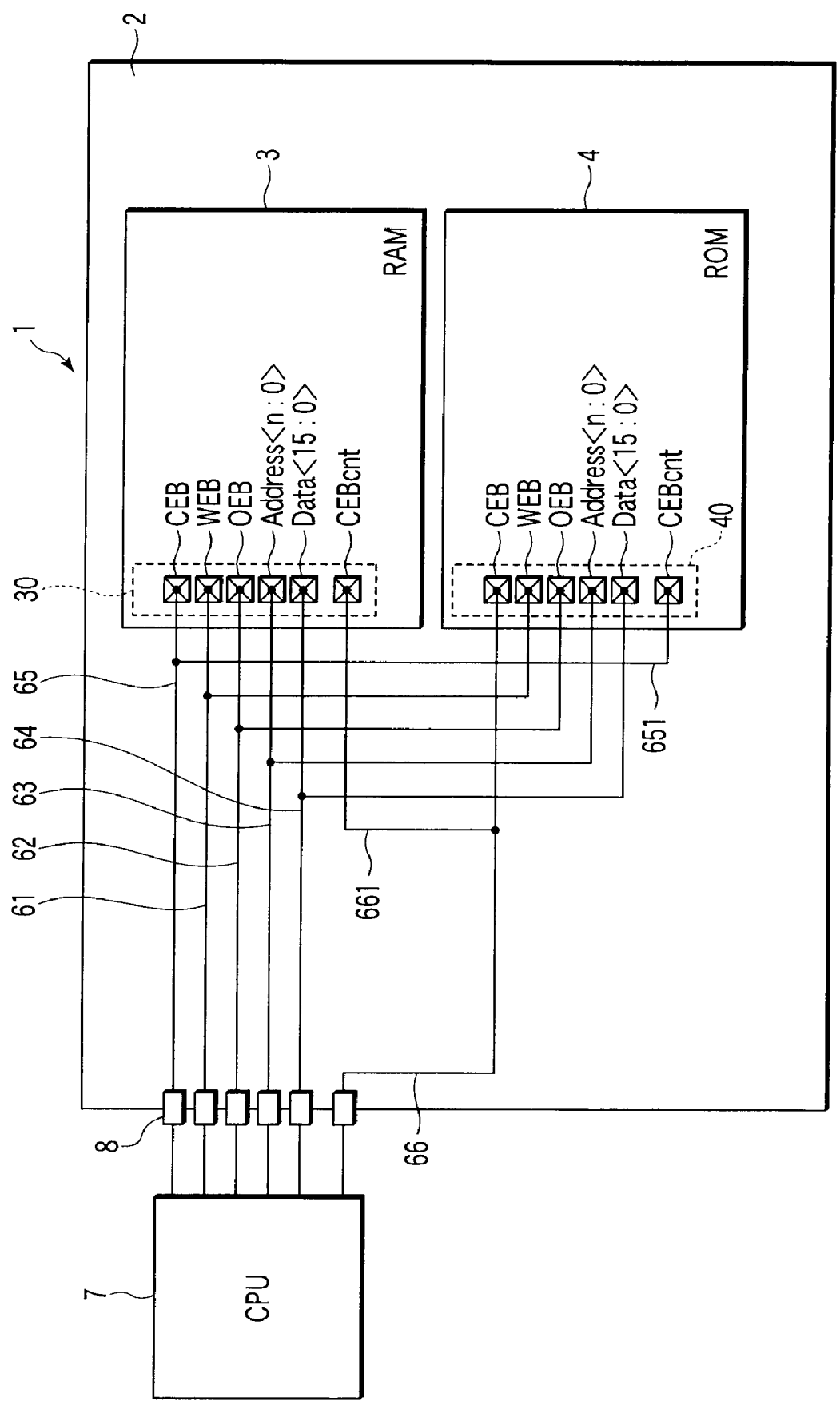
FIG. 1 is a block diagram of an MCP according to an embodiment of the present invention.

An embodiment of the present invention will be described hereinafter with reference to the accompanying drawings. The present invention can be practiced in many different forms and therefore is not limited to the embodiment to be described hereinafter. In the description, the same or functionally equivalent elements are denoted by the same reference numerals, to thereby simplify the description.

Embodiment

FIG. 1 is a schematic diagram of an MCP 1 according to an embodiment of the present invention. With this MCP 1, as shown in FIG. 1, a board 2, a RAM 3 (a first semiconductor storage device) which is a volatile semiconductor storage device placed on the board 2 and a ROM 4 (a second semiconductor storage device) which is a nonvolatile semiconductor storage device placed on the board 2 are combined on a single chip.

In the example shown in FIG. 1, the RAM 3 and the ROM 4 are placed side by side on the same board 2; however, they may be stacked on the board 2.

Here, the RAM is a semiconductor storage device which allows writing and reading of data and in which information is lost when the power supply is switched off. Specific examples of RAMs include SRAMs and DRAMs. However, the present invention is not limited to these devices. Furthermore, the ROM is a semiconductor storage device which allows writing and reading of data and in which information is not lost even when the power supply is switched off. Specific examples of ROMs include NOR- and NAND-type flash memories. However, the present invention is not limited to these devices.

Figure 2:
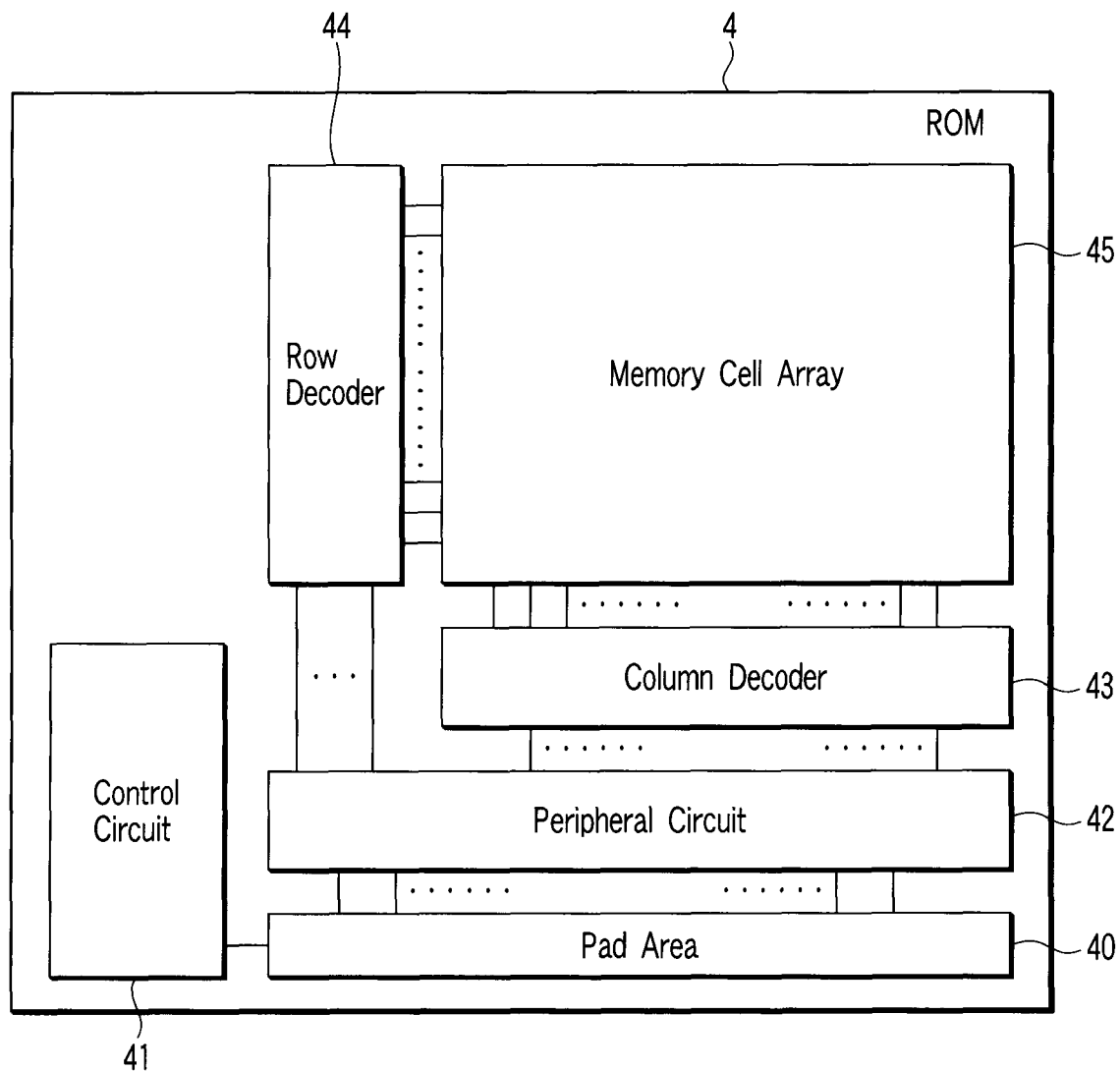
FIG. 2 is a block diagram of a flash memory as an example of a ROM.
Figure 3:
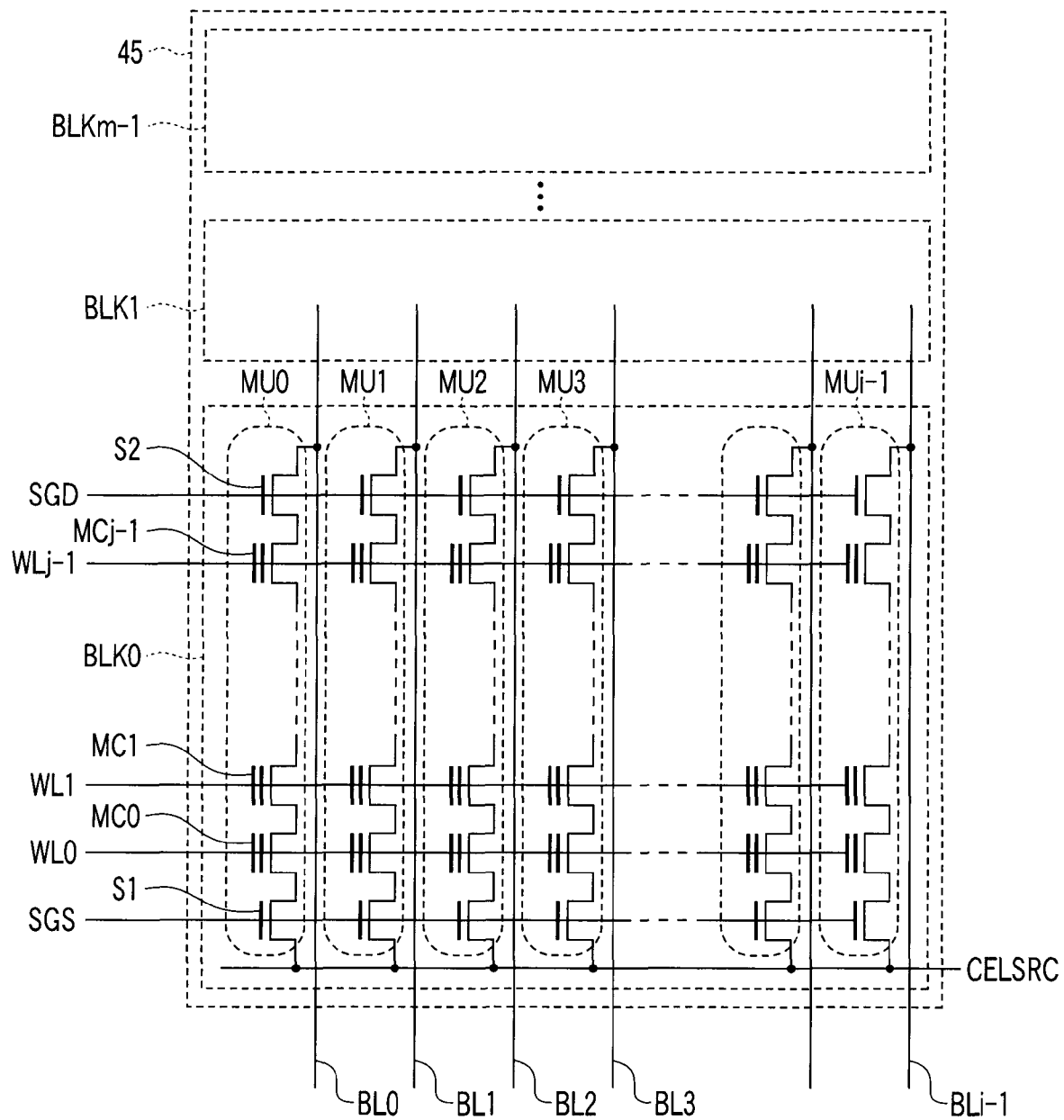
FIG. 3 shows a circuit arrangement of the flash memory.

FIG. 2 shows a functional block diagram of a NAND-type flash memory when it is used as an example of the ROM 4 in the MCP 1. FIG. 3 is a diagram for use in explanation of the arrangement of the memory cell array of that NAND-type flash memory. FIG. 4 shows a sectional view of a portion of the memory cell array.

The ROM 4 of FIG. 2, which is a NAND-type flash memory, has a pad area 40 connectable to interconnect lines formed on the board 2 of the MCP, a control circuit 41 and a peripheral circuit 42 which are connected to the pad area 40, a column decoder 43, a row decoder 44, and a memory cell array 45.

The memory cell array 45 of the NAND-type flash memory is composed, as shown in FIG. 3, of a number of memory cell blocks BLK0 through BLKm-1. Each memory cell block is composed of a number of memory cell units MU0 through MUi-1, a number of word lines WL0 through WLj-1, a source-side select gate line SGS, a drain-side select gate line SGD, each of these lines being connected in common to the memory cell units MU0 through MUi-1, and a number of bit lines BL0 through BLi-1 each of which is connected to a respective one of the memory cell units MU0 through MUi-1. In each memory cell unit, a drain-side select transistor S2 has its drain region connected to a corresponding bit line, and a source-side select transistor S1 has its source region connected to a common cell line CELSRC.

As shown in FIG. 4, the memory cell array has a semiconductor substrate 100, floating gates FG, the source-side select gate line SGS, the drain-side select gate line SGD, which are arranged over the semiconductor substrate 100 with a gate insulating film 101 interposed therebetween, control gates as word lines WL0 through Wli-1 arranged over the floating gates with an intergate insulating film 102 interposed therebetween, the bit line BL, an SGD shunt line 105D, an SGS shunt line 105S, and the cell line CELSRC, which are arranged over these interconnect lines with an insulating film 103 interposed therebetween. That is, the ROM 4 can store data through the use of such a structure.

As with the ROM 4, the RAM 3 has a pad area 30 connectable to an external CPU 7. Each of the pad areas 30 and 40 of the RAM 3 and the ROM 4 has a chip enable pad CEB which receives a signal to enable the chip (memory), a write enable pad WEB to enable writing into the chip, an output enable pad OEB to enable reading from the chip, an address signal pad Address to receive an address signal which indicates the address of a location to be written into or read from, and a data signal pad Data to receive data to be written or read.

As shown in FIG. 1, the pads of the RAM 3 and the ROM 4 are connected to the CPU 7 external to the MCP 1 via interconnect lines and terminals 8 formed on the board 2 of the MCP 1. Specifically, each of the RAM 3 and the ROM 4 has the chip enable signal pad (first pad) CEB which receives a chip enable signal, the write enable signal pad (second pad) WEB to receive a write enable signal, the output enable signal pad (third pad) OEB to receive an output enable signal, the address signal pad (fourth pad) Address to receive an address signal, and a data signal pad (fifth pad) Data to receive data to be written or read. Each of these pads is electrically connected to the CPU 7 via a corresponding interconnect line and a corresponding terminal 8. The RAM 3 has a chip enable control signal pad (sixth pad) CEBcnt which is electrically connected through an interconnect line 661 to the chip enable signal pad CEB of the ROM 4. Also, the ROM 4 has a chip enable control signal pad (seventh pad) CEBcnt which is electrically connected through an interconnect line 651 to the chip enable signal pad CEB of the RAM 3.

In the MCP 1 of this embodiment, the RAM 3 and the ROM 4 have their corresponding pads (chip enable signal pads, write enable signal pads, output enable signal pads, address signal pads, and data signal pads) connected together by an interconnect line.

The connection of each of the pads of each semiconductor storage device to outside will be described with reference to FIGS. 5 through 8.

Figure 5:
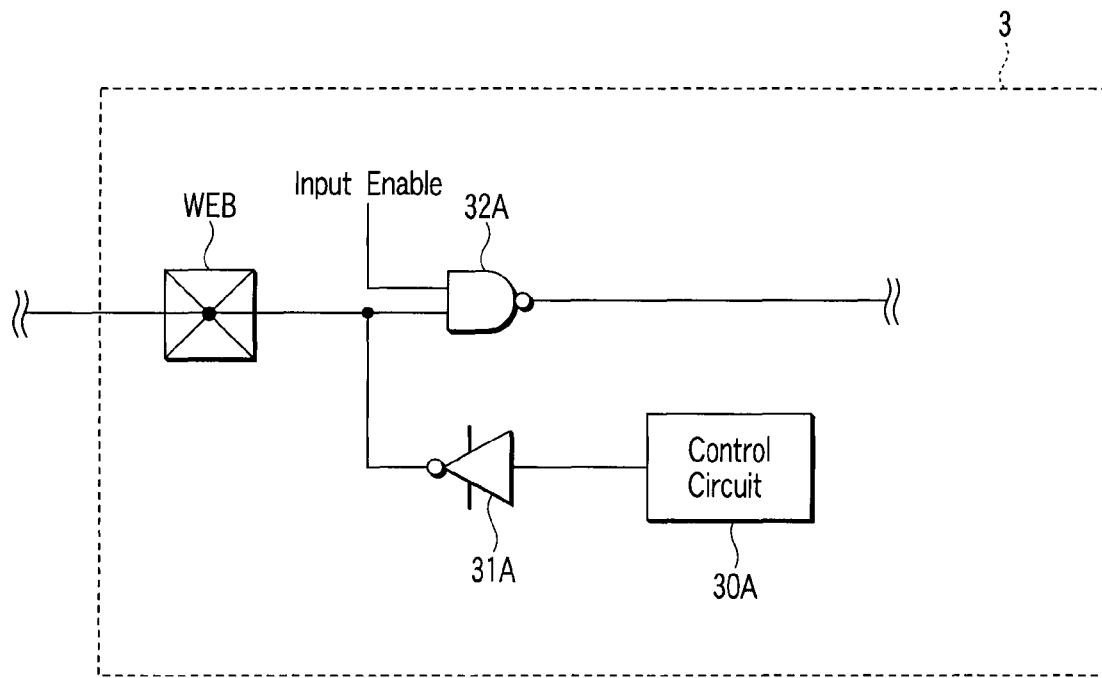
FIG. 5 shows a circuit arrangement associated with the write enable pad.

FIG. 5 shows the circuit arrangement associated with the write enable signal pad WEB of the RAM 3. The ROM 4 also has substantially the same circuit arrangement for its write enable signal pad. As shown in FIG. 5, the RAM 3 has a control circuit 30A, a clocked inverter 31A, and a NAND gate 32A.

The NAND gate 32A is connected to receive a write enable signal from the pad WEB, an output signal from the control circuit 30A, and an input enable signal. The output of the NAND gate 32A is connected to the internal circuit of the RAM 3. The circuit arrangement associated with the output enable signal pad OEB shown in FIG. 1 is substantially the same as the circuit arrangement for the write enable signal pad WEB.

Figure 6:
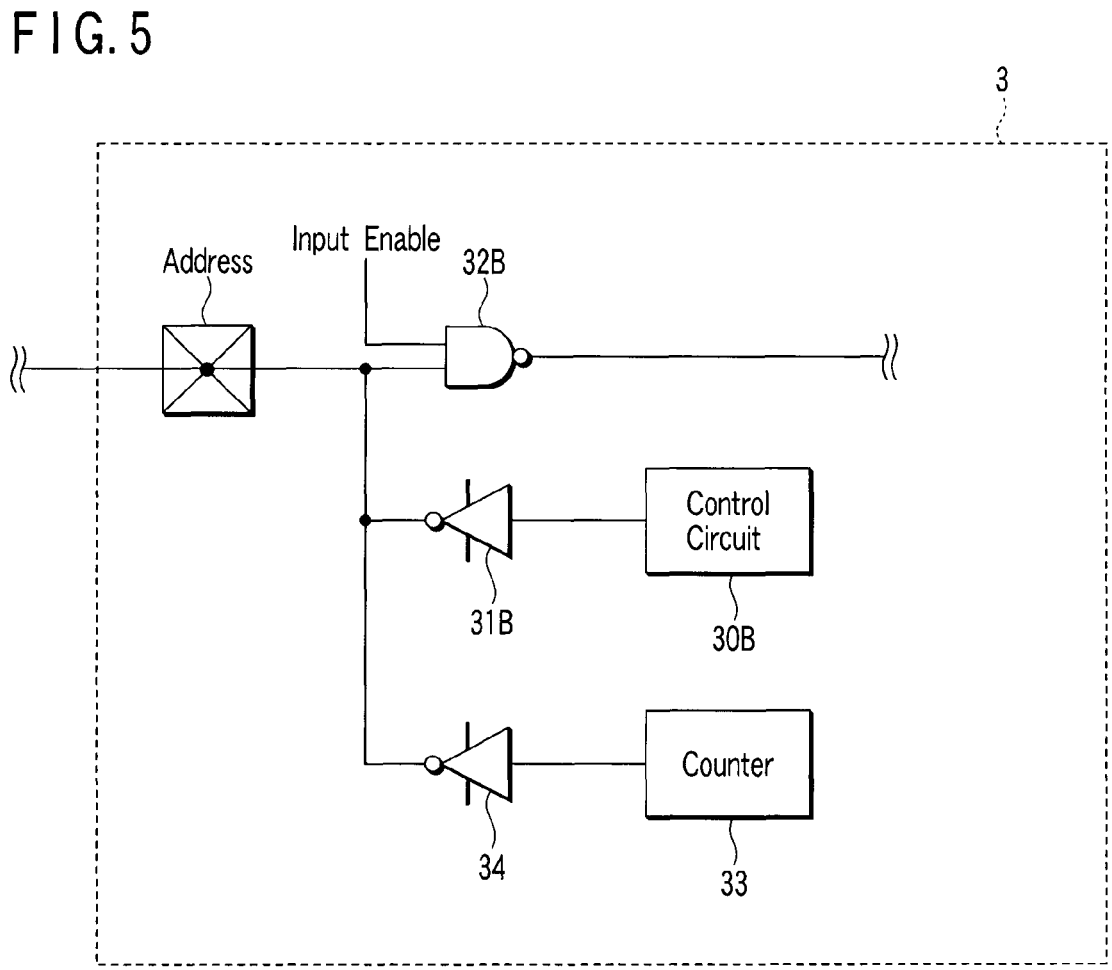
FIG. 6 shows a circuit arrangement associated with the address signal pad.

FIG. 6 shows the circuit arrangement associated with the address signal pad Address of the RAM 3. The ROM 4 also has substantially the same circuit arrangement for its address signal pad. As shown in FIG. 6, the RAM 3 has a control circuit 30B, a clocked inverter 31B connected to that control circuit, a counter 33, a clocked inverter 34 connected to that counter, and a NAND gate 32B.

The NAND gate 32B is connected to receive an address signal from the pad Address, output signals of the control circuit 30B and the counter 33, and an input enable signal. The output of the NAND gate 32B is connected to the internal circuit of the RAM 3.

FIG. 7 shows the circuit arrangement associated with the data signal pad Data of the RAM 3. The ROM 4 also has substantially the same circuit arrangement for its data signal pad. As shown in FIG. 7, the RAM 3 has a control circuit 30C, a clocked inverter 31C connected to that control circuit, a memory cell 35, a clocked inverter 36 connected to that memory cell, and a NAND gate 32C.

The NAND gate 32C is connected to receive a data signal from the pad Data, output signals of the control circuit 30C and the memory cell 35, and an input enable signal. The output of the NAND gate 32C is connected to the internal circuit of the RAM 3.

FIG. 8 shows the circuit arrangement associated with the chip enable control pad CEBcnt of the RAM 3. The ROM 4 also has substantially the same circuit arrangement for its chip enable control pad. The RAM 3 has a control circuit 30D and a clocked inverter 31D connected to that control circuit. The output signal of the control circuit 30D is output from the chip enable control pad CEBcnt to outside through the clocked inverter 31D.

The MCP of this embodiment thus configured allows data to be directly transferred from the RAM 3 to the ROM 4 or from the ROM 4 to the RAM 3. It therefore becomes possible to avoid the CPU's operation of reading data from one of the two semiconductor devices, saving it temporarily, and transferring it to the other storage device.

Figure 9:
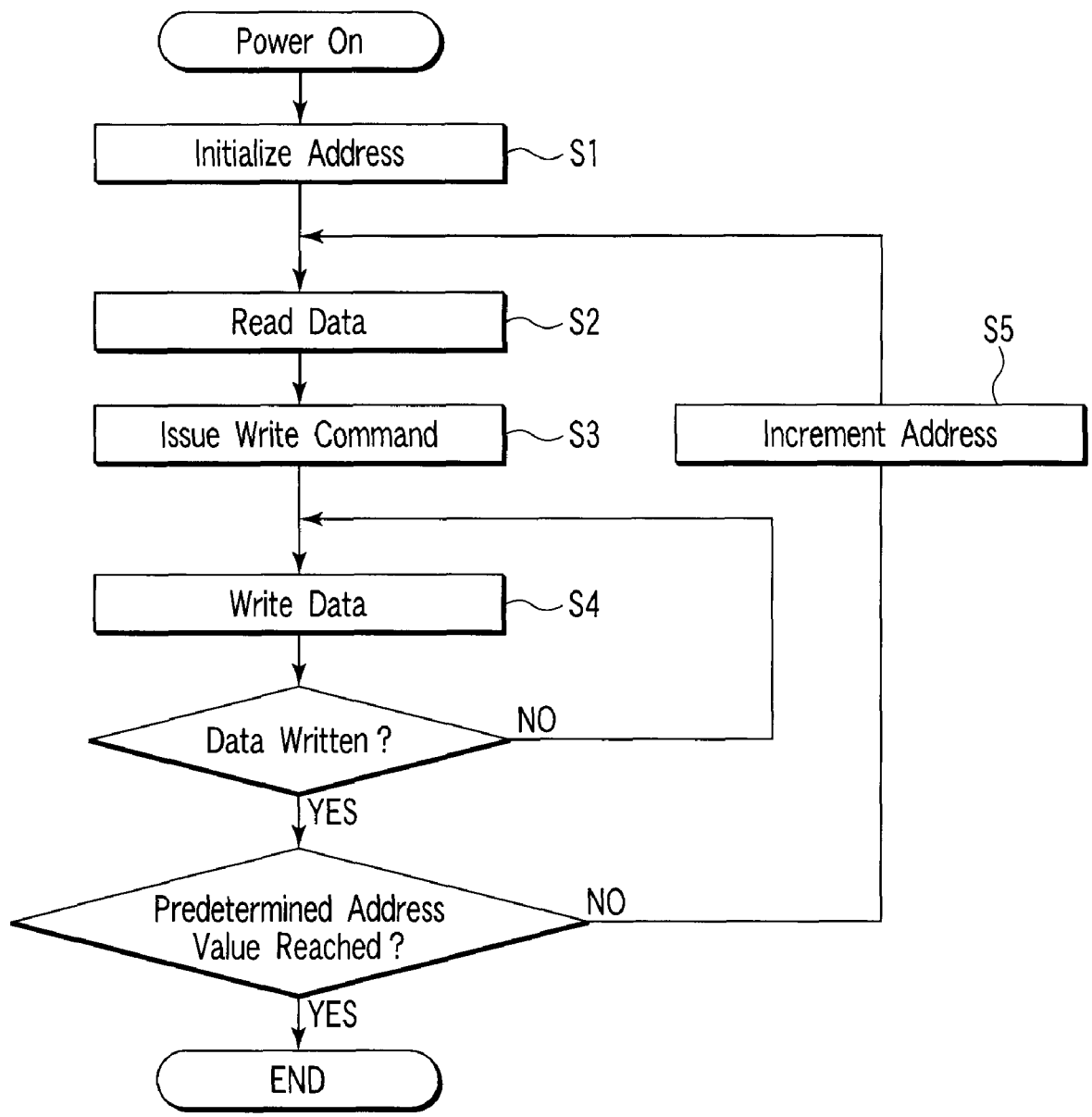
FIG. 9 is a flowchart for data transfer.

Next, data transfer using the MCP of this embodiment will be described. The data transfer in this embodiment is automatically initiated when the power is applied to the MCP by way of example. Reference is made to FIG. 9 to describe a flowchart of the data transfer sequence. The data transfer is carried out by a program previously incorporated into each of the semiconductor storage devices.

First, the address is initialized at the time the power is applied to the MCP (S01).

Next, the control circuit of the ROM 4 sets a first address to read data from the ROM (S02).

Next, the CPU 7 issues a write command to the RAM 3 (S03) and then writes the data already read into the RAM 3 (S04).

A decision is made as to whether or not data has been written into the RAM 3. If NOT, writing of data is carried out again. If data has been written into the RAM, then a decision is made as to whether or not the address has reached a predetermined value. If the data has not reached the predetermined value, the counter increments the address by one (S06). Reading data out of the ROM 4, issuing a write command and writing data into the RAM are repeated until the address reaches the predetermined value.

As described above, the use of the MCP of this embodiment allows data to be directly transferred between the RAM 3 and the ROM 4 without intervention of processing by the CPU, which leads to more efficient data transfer.

The above data transfer sequence is set to start when the power is applied to the MCP. However, this is not restrictive. As an example, the sequence may be set to start when a particular command, such as a write command, is input. By setting the sequence to start upon entry of the particular command, the RAM 3 is also allowed to carry out the same data write sequence.

Figure 10:
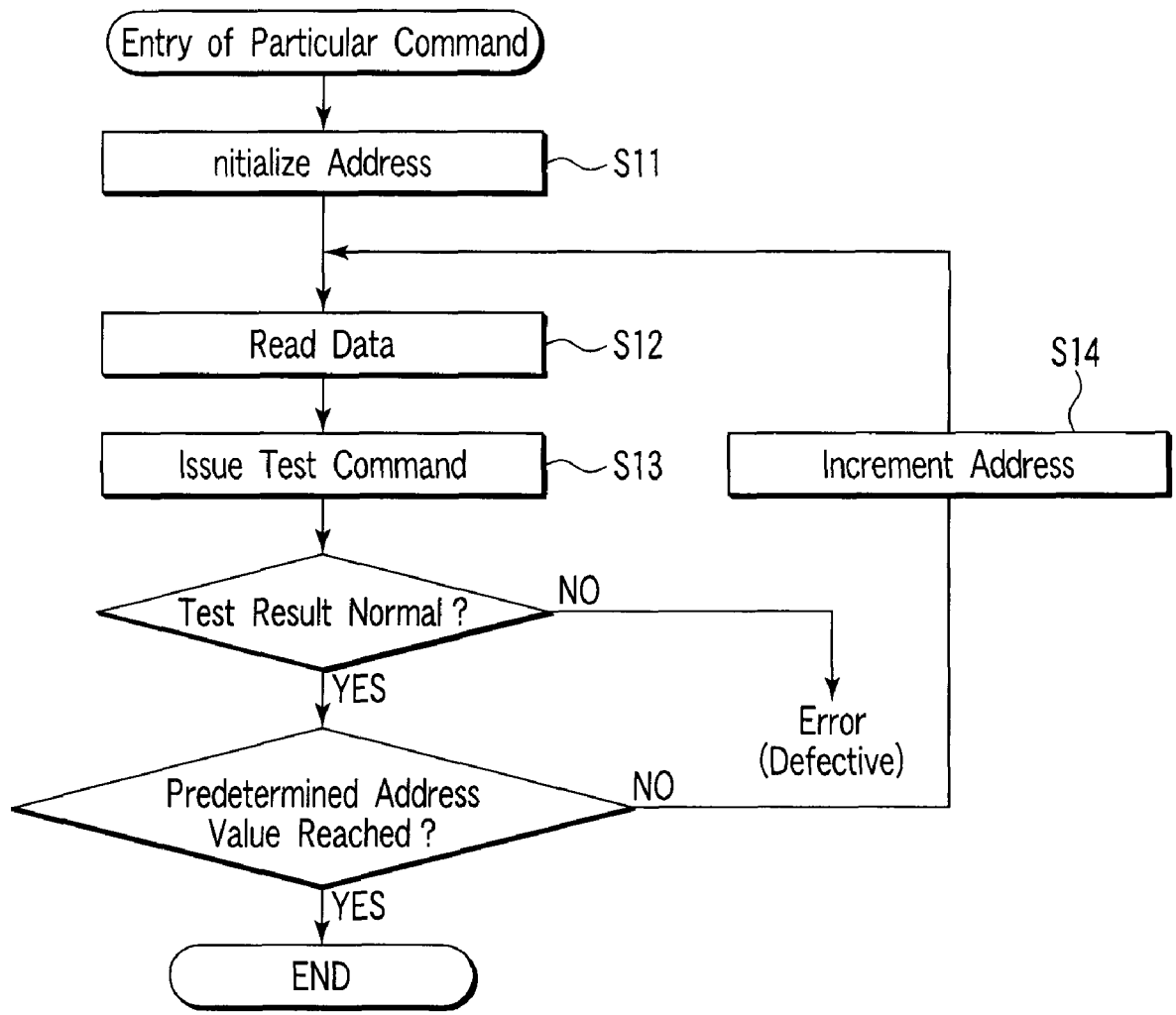
FIG. 10 is a flowchart for a testing operation.

Furthermore, the MCP can make a built-in self test (BIST) to confirm whether it functions correctly in addition to the data transfer processing. The test sequence is illustrated in a flowchart shown in FIG. 10.

First, the address is initialized when the particular command is input (S11). A first address is then set to read data from the ROM 4 (S12). Next, a BIST command is issued to the RAM 3 to make the test (S13). A decision is then made as to whether or not the test results are normal. If YES, then a decision is made as to whether or not the address has reached a predetermined value. If NOT, then the counter increments the address by one (S14). Then, reading data out of the ROM 4, issuing the test command and making the test are repeated until the address reaches the predetermined value. In the absence of such a configuration as in the MCP of this embodiment, when changes are made to the test program, the circuit itself has to be modified, decreasing the versatility of the MCP. On the other hand, the MCP of this embodiment requires no modification to the circuit when changes are made to the BIST program, allowing its versatility to be increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a board;
   a first semiconductor storage device which is a volatile semiconductor storage device placed on the board; and
   a second semiconductor storage device which is a nonvolatile semiconductor storage device placed on the board, each of the first and second semiconductor storage devices having a first pad for inputting a chip enable signal, a second pad for inputting a write enable signal, a third pad for inputting an output enable signal, a fourth pad for inputting an address signal, and a fifth pad for inputting data, the first semiconductor storage device having a sixth pad which is electrically connected to the first pad of the second semiconductor device, and the second semiconductor storage device having a seventh pad which is electrically connected to the first pad of the first semiconductor device.

2. The semiconductor device according to claim 1, wherein the first pad of the first semiconductor storage device is electrically connected to the first pad of the second semiconductor storage device, the second pad of the first semiconductor storage device is electrically connected to the second pad of the second semiconductor storage device, the third pad of the first semiconductor storage device is electrically connected to the third pad of the second semiconductor storage device, the fourth pad of the first semiconductor storage device is electrically connected to the fourth pad of the second semiconductor storage device, and the fifth pad of the first semiconductor storage device is electrically connected to the fifth pad of the second semiconductor storage device.

3. The semiconductor device according to claim 1, wherein the first semiconductor storage device has a control circuit which is stored with a program which allows data transfer from the first semiconductor storage device to the second semiconductor storage device.

4. The semiconductor device according to claim 1, wherein the second semiconductor storage device has a control circuit which is stored with a program which allows data transfer from the second semiconductor storage device to the first semiconductor storage device.

5. The semiconductor device according to claim 4, wherein the program stored in the control circuit executes data transfer when the power is applied or a particular command is input.

6. The semiconductor device according to claim 1, wherein the second pad is connected to a NAND gate connected to receive an input enable signal and a control circuit in the first and second storage device.

7. The semiconductor device according to claim 1, wherein the fourth pad is connected to a NAND gate connected to receive an input enable signal, a control circuit, and a counter in the first and second storage device.

8. The semiconductor device according to claim 1, wherein the fifth pad is connected to a NAND gate connected to receive an input enable signal, a control circuit, and a memory cell array in the first and second storage device.

9. The semiconductor device according to claim 1, wherein the sixth pad is connected to a control circuit in the first and second storage device.

10. The semiconductor device according to claim 1, wherein the first semiconductor device is a DRAM.

11. The semiconductor device according to claim 1, wherein the first semiconductor device is an SRAM.

12. The semiconductor device according to claim 1, wherein the second semiconductor device is a flash memory.

* * * * *